US010158325B2

(12) United States Patent
Nakanishi et al.

(10) Patent No.: US 10,158,325 B2
(45) Date of Patent: *Dec. 18, 2018

(54) INSPECTION APPARATUS AND INSPECTION METHOD

(71) Applicants: SCREEN HOLDINGS CO., LTD., Kyoto-shi, Kyoto (JP); OSAKA UNIVERSITY, Suita-shi, Osaka (JP)

(72) Inventors: Hidetoshi Nakanishi, Kyoto (JP); Akira Ito, Kyoto (JP); Iwao Kawayama, Suita (JP); Masayoshi Tonouchi, Suita (JP)

(73) Assignees: Screen Holdings Co., Ltd., Kyoto (JP); Osaka University, Osaka (JP)

( * ) Notice: Subject to any disclaimer, the term of this patent is extended or adjusted under 35 U.S.C. 154(b) by 201 days.

This patent is subject to a terminal disclaimer.

(21) Appl. No.: 14/566,428

(22) Filed: Dec. 10, 2014

(65) Prior Publication Data

US 2015/0162872 A1 Jun. 11, 2015

(30) Foreign Application Priority Data

Dec. 10, 2013 (JP) .................................. 2013-254807

(51) Int. Cl.
*H02S 50/15* (2014.01)
*G01R 31/265* (2006.01)

(52) U.S. Cl.
CPC .......... *H02S 50/15* (2014.12); *G01R 31/2656* (2013.01)

(58) Field of Classification Search
None
See application file for complete search history.

(56) References Cited

U.S. PATENT DOCUMENTS 3,337,782 A * 8/1967 Todaro, Jr. .............. H01L 29/00
257/152
6,300,558 B1 * 10/2001 Takamoto ........... H01L 31/0735
136/249

(Continued)

FOREIGN PATENT DOCUMENTS

JP 2006-024774 A 1/2006
JP 2009-175127 A 8/2009

(Continued)

OTHER PUBLICATIONS

Office Action issued in corresponding Japanese Patent Application No. 2013-254807, dated Aug. 1, 2017.

(Continued)

*Primary Examiner* — Paresh H Patel
(74) *Attorney, Agent, or Firm* — McDermott Will & Emery LLP

(57) ABSTRACT

An inspection apparatus inspects a solar cell. The inspection apparatus includes: a short-circuiting element that electrically connects an anode as a p-type semiconductor layer and a cathode as an n-type semiconductor layer of the solar cell to short-circuit the solar cell; an irradiation part that irradiates the solar cell short-circuited by the short-circuiting element with pulse light; and a detection part that detects an electromagnetic wave emitted from the solar cell in response to the irradiation of the solar cell with pulse light from the irradiation part.

6 Claims, 10 Drawing Sheets

(56) References Cited

U.S. PATENT DOCUMENTS

| | | | |
|---|---|---|---|
| 6,802,753 B1* | 10/2004 | Ando | H01J 9/027 445/24 |
| 6,956,645 B2* | 10/2005 | Wittman | B41J 2/195 356/300 |
| 7,518,135 B2* | 4/2009 | Ivanov | B82Y 10/00 250/492.2 |
| 7,683,778 B2* | 3/2010 | Ouchi | G01N 22/00 250/358.1 |
| 7,687,826 B2* | 3/2010 | Schulze | H01L 29/0692 257/115 |
| 8,129,683 B2 | 3/2012 | Itsuji et al. | |
| 9,234,934 B2* | 1/2016 | Nakanishi | G01N 21/9501 |
| 9,383,321 B2* | 7/2016 | Nakanishi | G01N 21/6489 |
| 9,541,508 B2* | 1/2017 | Nakanishi | G01N 21/9501 |
| 9,651,607 B2* | 5/2017 | Nakanishi | G01R 31/2607 |
| 2011/0012636 A1* | 1/2011 | Carstensen | G01R 31/2656 324/761.01 |
| 2011/0216312 A1 | 9/2011 | Matsumoto et al. | |
| 2011/0277832 A1* | 11/2011 | Shimizu | B82Y 30/00 136/256 |
| 2013/0015368 A1 | 1/2013 | Nakanishi et al. | |
| 2013/0037109 A1 | 2/2013 | Park et al. | |
| 2013/0083319 A1 | 4/2013 | Nakanishi et al. | |
| 2015/0276607 A1* | 10/2015 | Nakanishi | G01N 21/9501 250/459.1 |

FOREIGN PATENT DOCUMENTS

| | | |
|---|---|---|
| JP | 2010-060317 A | 3/2010 |
| JP | 2013-019861 A | 1/2013 |
| JP | 2013-061219 A | 4/2013 |
| JP | 2013-072843 A | 4/2013 |
| JP | 2013-084784 A | 5/2013 |
| JP | 2013-526082 A | 6/2013 |
| WO | 2011/140100 A2 | 11/2011 |

OTHER PUBLICATIONS

S. Tardon et al., "Photoluminescence studies of a-Si:H/c-Si-heterojunction solar cells," Journal of Non-Crystalline Solids, vols. 338-340, pp. 444-447 (Jun. 15, 2004).

Japanese Office Action issued in corresponding Japanese Patent Application No. 2013-254807, dated Feb. 13, 2018, with English Translation.

* cited by examiner

F I G. 1
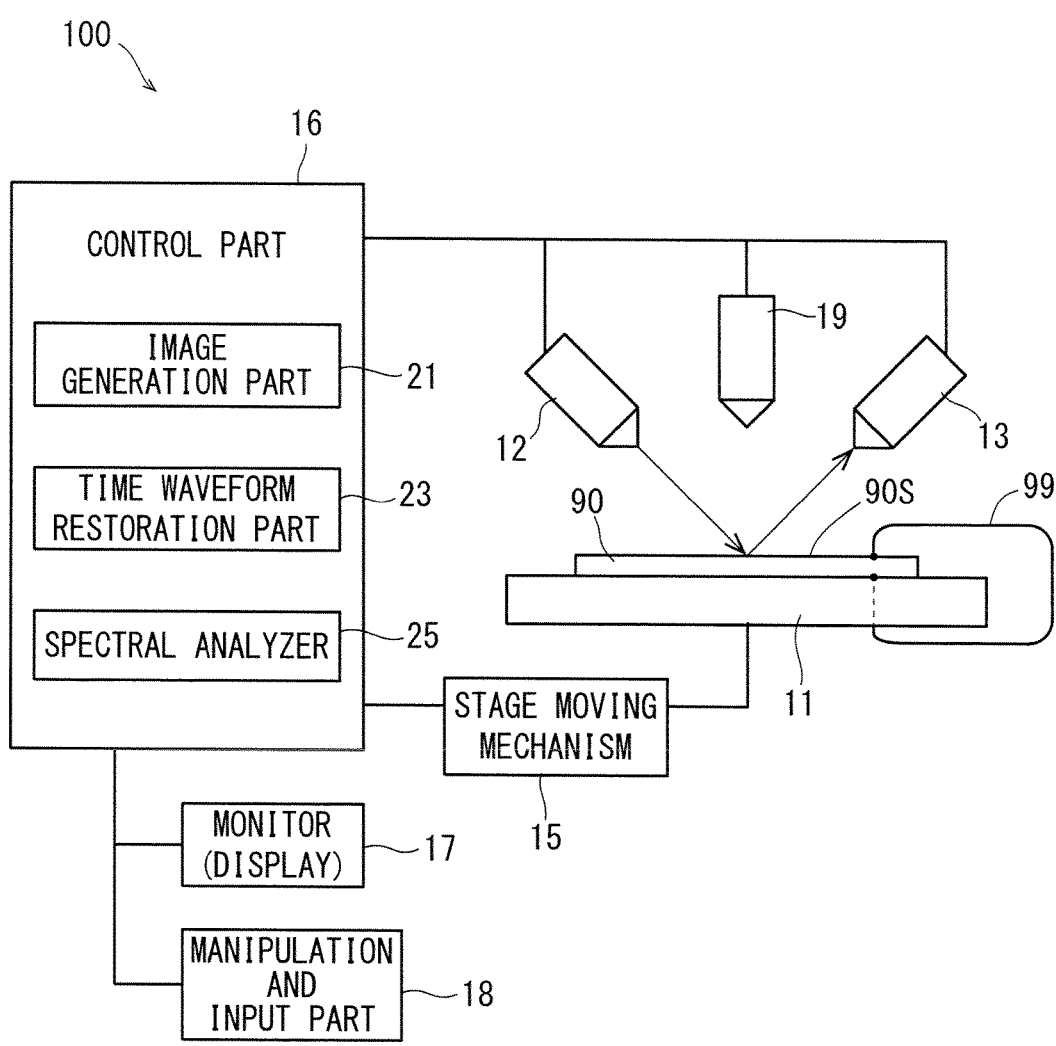

F I G. 4
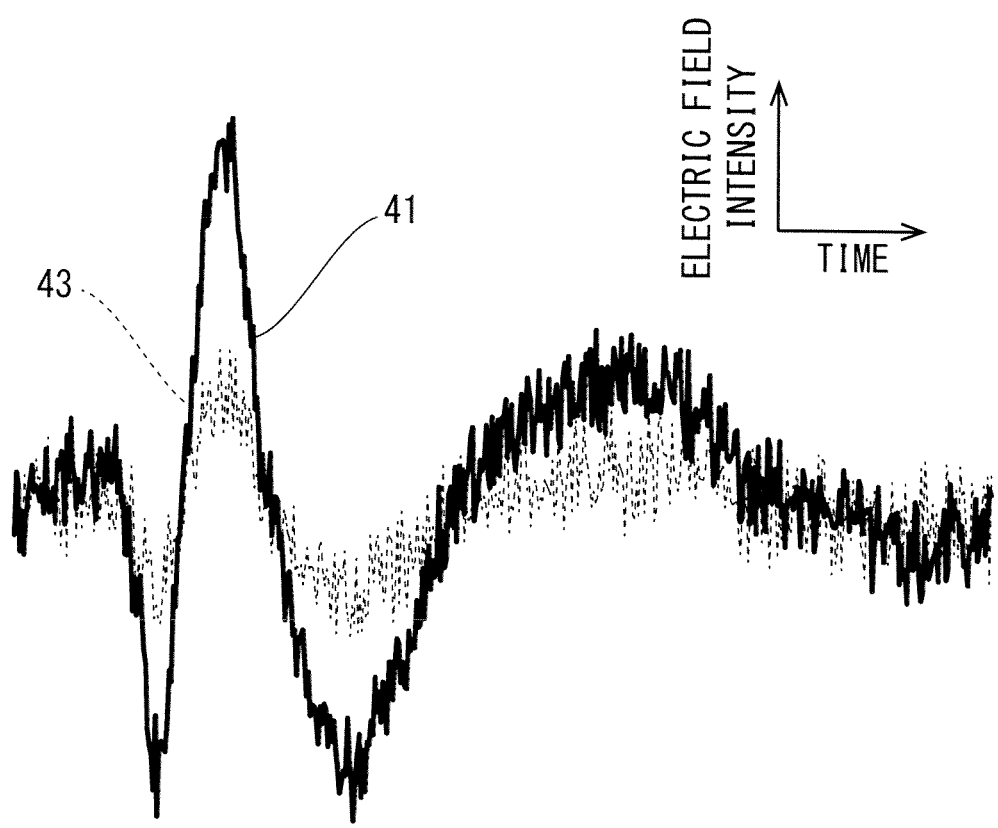

INSPECTION APPARATUS AND INSPECTION METHOD

BACKGROUND OF THE INVENTION

Field of the Invention

The present invention relates to a technology of inspecting a semiconductor device, a photo device, or a light emitting device.

Description of the Background Art

Nowadays, a technical development that visualizes dynamic behaviors such as generation, acceleration, and recombination of photocarriers (particularly, electrons), what is called carrier dynamics has been expected in fields of a semiconductor and a photo device, particularly in the field of a solar cell. An observation system used in time regions of femtosecond to picosecond is required in the carrier dynamics.

There is performed research and development on an observation system in which an electromagnetic wave (terahertz wave, $10^{12}$Hz) in a terahertz region is used. The electromagnetic wave in the terahertz region has high transmissivity like a radio wave and rectilinear traveling property like light, and practical use of the electromagnetic wave is developed in the fields of communication, security, and non-destructive inspection.

For example, in Japanese Patent Application Laid-Open No. 2013-19861, the photo device as an inspection object is irradiated with the light to detect the emitted electromagnetic wave in the terahertz region. The photocarriers (free electrons or holes) excited by the irradiation of the inspection object with the light is accelerated and moved by an internal electric field. Therefore, the electromagnetic wave is emitted to the outside. Characteristics of the photo device are inspected by detecting the emitted electromagnetic wave.

Japanese Patent Application Laid-Open No. 2013-19861 also discloses that a reverse bias voltage is applied to the photo device in order to enhance an S/N ratio of an intensity of the detected electromagnetic wave. The acceleration of the photocarrier is increased by applying the reverse bias voltage, thereby increasing the intensity of the emitted electromagnetic wave.

As to an alternative method for applying an external electric field, Japanese Patent Application Laid-Open No. 2013-72843 proposes that the inspection object is irradiated with the high-intensity electromagnetic wave to apply the reverse bias voltage to a measurement place.

However, in the conventional technology, it is necessary to provide a circuit or light source applying the reverse bias voltage in order to improve the S/N ratio of the electromagnetic wave intensity, which results in an increase of apparatus cost and a troublesome work to optimize a condition.

SUMMARY OF THE INVENTION

The present invention is aimed at an inspection apparatus that inspects an inspection object including an anode and a cathode.

In accordance with one aspect of the present invention, an inspection apparatus includes: a short-circuiting element that electrically connects an anode and a cathode of an inspection object to short-circuit the inspection object; an irradiation part that irradiates the inspection object short-circuited by the short-circuiting element with light; and a detection part that detects an electromagnetic wave emitted from the inspection object in response to the irradiation of the inspection object with the light from the irradiation part.

The internal electric field can easily be enhanced in the inspection object by sort-circuiting the anode and the cathode. Therefore, because the intensity of the emitted electromagnetic wave can be enhanced, the S/N ratio of the detected electromagnetic wave can be improved.

Preferably the anode is a p-type semiconductor and the cathode is an n-type semiconductor.

The internal electric field can easily be enhanced with respect to the inspection object including the p-type semiconductor and the n-type semiconductor.

Preferably the inspection object is a multi-junction type solar cell formed by stacking plural solar cells having absorption wavelength regions different from each other.

The intensity of the emitted electromagnetic wave can be enhanced without applying the reverse bias voltage with respect to the multi-junction type solar cell. Therefore, the breakage of the solar cell can be constrained.

The present invention is aimed at an inspection method for inspecting an inspection object including an anode and a cathode.

In accordance with one aspect of the present invention, an inspection method includes the steps of: (a) electrically connecting the anode and the cathode to short-circuit the inspection object; and (b) irradiating the inspection object short-circuited in the step (a) with light to detect an electromagnetic wave emitted from the inspection object in response to the irradiation of the inspection object with the light.

Preferably the anode is a p-type semiconductor and the cathode is an n-type semiconductor.

Preferably the inspection object is a multi-junction type solar cell formed by stacking plural solar cells having absorption wavelength regions different from each other.

Therefore, an object of the present invention is to provide a technology of easily enhancing the intensity of the electromagnetic wave emitted from the inspection object.

These and other objects, features, aspects and advantages of the present invention will become more apparent from the following detailed description of the present invention when taken in conjunction with the accompanying drawings.

BRIEF DESCRIPTION OF THE DRAWING

FIG. 1 is a schematic diagram illustrating a configuration of an inspection apparatus according to a preferred embodiment;

FIG. 4 is a view illustrating a time waveform of an electromagnetic wave emitted from the solar cell in a short-circuit state and a time waveform of an electromagnetic wave emitted from the solar cell in an opened state;

DESCRIPTION OF THE PREFERRED EMBODIMENTS

Figure 2:
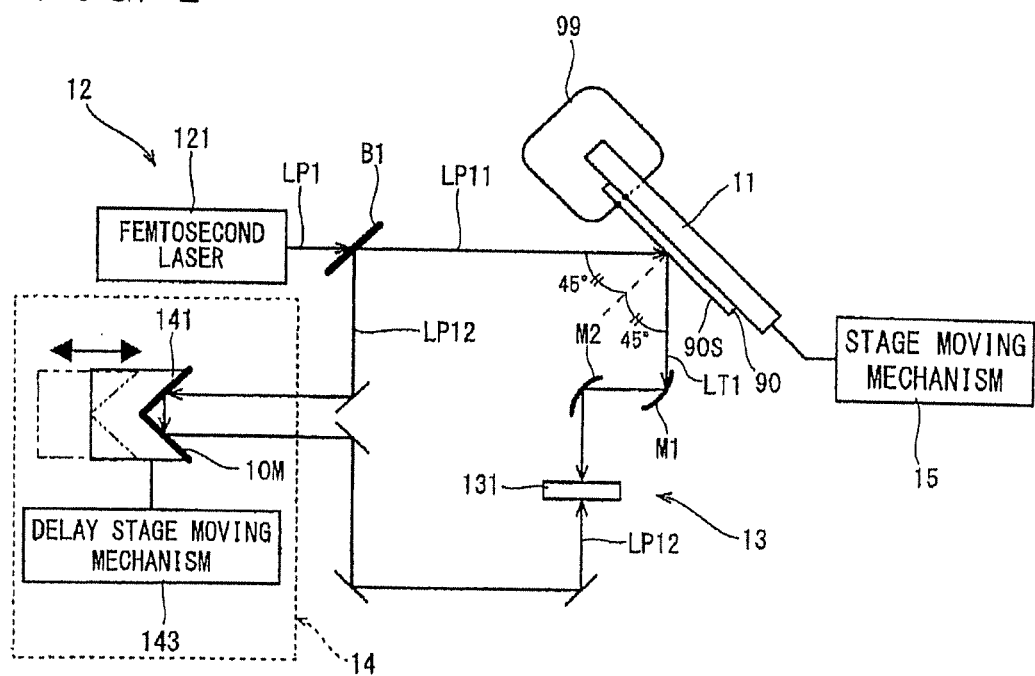
FIG. 2 is a schematic diagram illustrating configurations of an irradiation part, a detection part, and a delay unit that are included in the inspection apparatus.

Hereinafter, preferred embodiments of the present invention will be described below with reference to the accompanying drawings. In the drawings, for the sake of easy understanding, a size of each unit or the number of units is exaggerated or simplified as needed basis. The components of the preferred embodiment are described only by way of example, but the present invention is not limited to the preferred embodiment.

<1. Preferred Embodiment>
<1.1. Configuration and Function>

FIG. 1 is a schematic diagram illustrating a configuration of an inspection apparatus 100 according to a preferred embodiment. FIG. 2 is a schematic diagram illustrating configurations of an irradiation part 12, a detection part 13, and a delay part 14 that are included in the inspection apparatus 100.

The inspection apparatus 100 irradiates an inspection object that is of a semiconductor device or a photo device with pulse light, and detects an electromagnetic wave (for example, a terahertz wave having frequencies of 0.1 THz to 30 THz) that is emitted from the inspection object in response to the irradiation of the inspection object with the pulse light, thereby inspecting the inspection object.

As used herein, the semiconductor device means electronic devices in which a transistor, an integrated circuit (IC or LSI), a resistor, and a capacitor are made of semiconductor. The photo device means electronic devices, such as a photodiode, image sensors such as a CMOS sensor and a CCD sensor, a solar cell, and an LED, in which a semiconductor photoelectric effect is used. The surface of the inspection object is formed flat. Alternatively, the surface of the inspection object may be formed into a curved shape.

In the preferred embodiment, a solar cell 90 is inspected as the inspection object by way of example. However, the semiconductor device and the photo device can also be inspected.

As illustrated in FIGS. 1 and 2, the inspection apparatus 100 includes a stage 11, the irradiation part 12, the detection part 13, the delay part 14, a stage moving mechanism 15, a control part 16, a monitor 17, a manipulation and input part 18, and a camera 19.

The solar cell 90 is held on the stage 11 by fixing means (not illustrated). Examples of the fixing means include means in which a clipping tool clipping a substrate is used, an adhesive sheet, and a suction hole formed in a surface of the stage 11. Alternatively, any fixing means may be used as long as the solar cell 90 can be fixed. In the preferred embodiment, the solar cell 90 is held on the stage 11 such that the irradiation part 12 and the detection part 13 are arranged on a side of a light receiving surface (surface 90S) of the solar cell 90.

As illustrated in FIG. 2, the irradiation part 12 includes a femtosecond laser 121. For example, the femtosecond laser 121 emits pulse light (pulse light LP1) having a wavelength including visible light regions of 360 nm (nanometer) to 1.5 μm (micrometer). Specifically, the femtosecond laser 121 emits the linearly-polarized pulse light having a center wavelength of around 800 nm, periods of several kilohertz to several hundred megahertz, and pulse widths of about 10 femtosecond to about 150 femtosecond. Alternatively, the femtosecond laser 121 may emit the pulse light having another wavelength region (for example, visible light wavelength such as a blue wavelength (450 nm to 495 nm) and a green wavelength (495 nm to 570 nm)).

The pulse light LP1 emitted from the femtosecond laser 121 is split into two by a beam splitter B1. Although not illustrated, a light chopper performs several-kilohertz modulation to one of the split pieces of pulse light (pulse light LP11). For example, an AOM (Acousto-Optic Modulator) may be used as a modulation element. The modulated pulse light LP11 is guided to the solar cell 90. The other piece of pulse light (pulse light LP12) split by the beam splitter B1 is guided to a detector 131 of the detection part 13 detecting the electromagnetic wave.

The irradiation part 12 irradiates the solar cell 90 with the pulse light LP11 from the light receiving surface side. The solar cell 90 is irradiated with the pulse light LP11 such that an optical axis of the pulse light LP11 is obliquely incident to the light receiving surface of the solar cell 90. In the first preferred embodiment, an irradiation angle is set such that an incident angle becomes 45 degrees. However, the incident angle is not limited to 45 degrees, but the incident angle can be properly changed within a range of 0 degree to 90 degrees.

Figure 3:
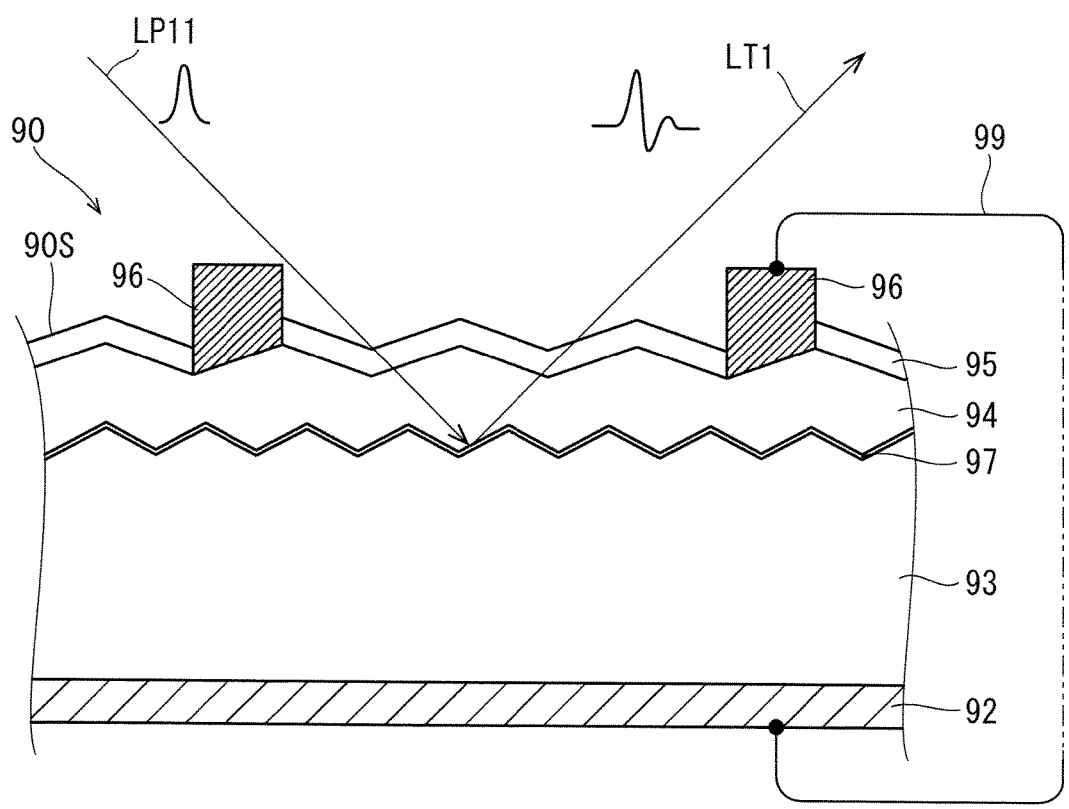
FIG. 3 is a schematic sectional view of a solar cell.

FIG. 3 is a schematic sectional view of the solar cell 90. For example, the solar cell 90 is constructed as a crystalline silicon solar cell. The solar cell 90 has a stacked structure including a plate-shape backside electrode 92 made of aluminum, a p-type silicon layer 93, an n-type silicon layer 94, an anti-reflection film 95, a lattice-shape light receiving surface electrode 96, and a pn-junction 97 in the ascending order. The anti-reflection film 95 is made of oxide silicon, nitride silicon, or oxide titanium and the like.

In principal surfaces on both sides of the solar cell 90, the principal surface on the side on which the light receiving surface electrode 96 is provided constitutes the light receiving surface. That is, the solar cell 90 is designed to suitably generate power by receiving the light from the light receiving surface side. A transparent electrode may be used as the light receiving surface electrode 96.

The inspection apparatus 100 may be applied to the inspection of a solar cell (such as an amorphous silicon solar cell) other than the crystalline silicon solar cell. For the amorphous silicon solar cell, generally energy gaps of 1.75 eV to 1.8 eV are larger than an energy gap of 1.2 eV of the crystalline silicon solar cell. In such cases, the terahertz wave can well be generated in the amorphous silicon solar cell by setting the wavelength of the femtosecond laser 121 to, for example, 700 μm or less. The inspection apparatus 100 can also be applied to other semiconductor solar cell (such as a CIGS solar cell and a GaAs solar cell) with a similar way of thinking.

When a region in which an internal electric field of the solar cell 90 exists is irradiated with the pulse light LP11 having energy exceeding a bandgap, photocarriers (free electrons and holes) are generated, and accelerated by the internal electric field. Therefore, a pulse-shape current is generated, and an electromagnetic wave is generated according to the pulse-shape current. It is well known that the internal electric field is generated in the pn-junction 97 or a Schottky junction.

As illustrated in FIG. 2, electromagnetic wave LT1 emitted from the solar cell 90 is collected by parabolic mirrors M1 and M2. More particularly, the parabolic mirrors M1 and M2 collect the electromagnetic wave LT1 emitted on the side identical to the surface 90S irradiated with the pulse light LP11. The collected electromagnetic wave LT1 is incident to the detector 131.

The detector 131 is constructed with a photoconductive switch (photoconductive antenna) to which the pulse light LP12 is incident. For example, a dipole type photoconductive switch, a bow-tie type photoconductive switch, and a spiral type photoconductive switch are well known. When the detector 131 is irradiated with the pulse light LP12 while the electromagnetic wave LT1 is incident to the detector 131, the current is instantaneously generated in the photoconductive switch according to an electric field intensity of the electromagnetic wave LT1. The current corresponding to the electric field intensity is converted into a digital quantity through a lock-in amplifier, an I/V conversion circuit, and an A/D conversion circuit (all of which are not illustrated). Thus, the detection part 13 detects the electric field intensity of the electromagnetic wave LT1 emitted from the solar cell 90 in response to the irradiation of the solar cell 90 with the pulse light LP12.

Other elements such as a Schottky barrier diode may be used as the detector 131. The Schottky barrier diode having small polarization dependence is suitable for the detector 131. Alternatively, a non-linear optical crystal may be used as the detector 131.

The delay part 14 is provided on an optical path of the pulse light LP12 from the beam splitter B1 to the detector 131. The delay part 14 is an optical element that continuously changes an arrival time the pulse light LP12 reaches the detector 131.

More particularly, the delay part 14 includes a delay stage 141 and a delay stage moving mechanism 143. The delay stage 141 includes a return mirror 10M that turns back the pulse light LP12 along an incident direction. The delay stage moving mechanism 143 translates the delay stage 141 along the incident direction of the pulse light LP12 under the control of the control part 16. The translation of the delay stage 141 continuously changes an optical path length of the pulse light LP12 from the beam splitter B1 to the detector 131.

The delay stage 141 changes a time difference between the time the electromagnetic wave LT1 reaches the detector 131 and the time the pulse light LP12 reaches the detector 131. The delay stage 141 changes the optical path length of the pulse light LP12, which allows the detector 131 to delay the time (detection time or sampling time) the electric field intensities of the electromagnetic wave LT1 is detected.

The time the pulse light LP12 reaches the detector 131 can be changed by another configuration different from the delay stage 141. Specifically, an electro-optical effect may be used. That is, an electro-optical element in which a refractive index is changed by changing an applied voltage may be used as the delay element. For example, the electro-optical element disclosed in Japanese Patent Application Laid-Open No. 2009-175127 may be used.

Alternatively, the optical path length of the pulse light LP11 or the optical path length of the electromagnetic wave LT1 emitted from the solar cell 90 may be changed. In this case, a time the electromagnetic wave LT1 reaches the detector 131 can be shifted relative to the time the pulse light LP12 reaches the detector 131. That is, the time the detector 131 detects the electric field intensity of the electromagnetic wave LT1 can be delayed.

The inspection apparatus 100 includes a short-circuiting element 99 that short-circuits the solar cell 90. For example, the short-circuiting element 99 is constructed with an electric wire. One end of the short-circuiting element 99 is connected to the light receiving surface electrode 96 attached to the n-type semiconductor layer 94 (cathode), and the other end is connected to the backside electrode 92 attached to the p-type semiconductor layer 93 (anode). Thus, the short-circuiting element 99 electrically connects the cathode and anode of the solar cell 90 to put the solar cell 90 into a short-circuit state.

FIG. 4 is a view illustrating a time waveform 41 of the electromagnetic wave emitted from the solar cell 90 in the short-circuit state and a time waveform 43 of the electromagnetic wave emitted from the solar cell 90 in an opened state. In FIG. 4, a horizontal axis indicates the time and a vertical axis indicates the electromagnetic wave intensity.

As used herein, the "opened state" means a state in which the backside electrode 92 and light receiving surface electrode 96 of the solar cell 90 are not electrically connected to each other. As is clear from FIG. 4, an intensity of the time waveform 41 of the electromagnetic wave LT1 emitted from the solar cell 90 in the short-circuit state is larger than that of the time waveform 43 in the opened state. A factor that increases the electric field intensity of the electromagnetic wave LT1 emitted by the short circuit will be described with reference to FIGS. 5 and 6.

Figure 5:
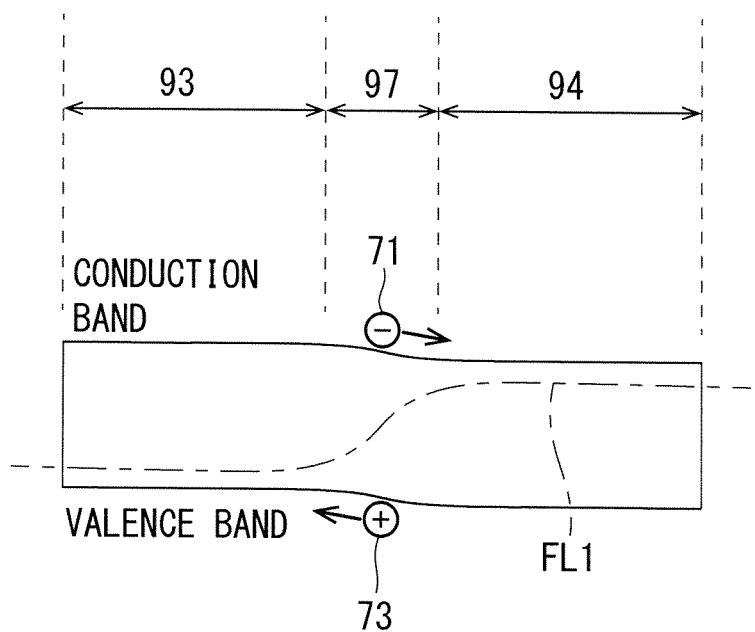
FIG. 5 is a view illustrating an energy band of the solar cell in the opened state.
Figure 6:
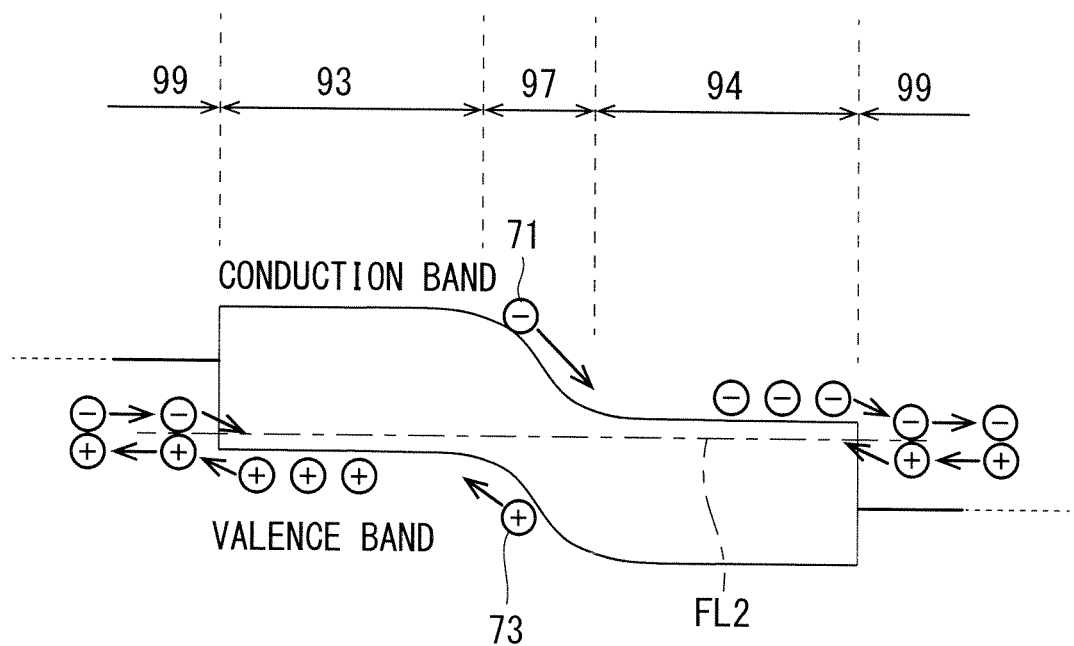
FIG. 6 is a view illustrating an energy band of the solar cell in the short-circuit state.

FIG. 5 is a view illustrating an energy band of the solar cell 90 in the opened state. FIG. 6 is a view illustrating the energy band of the solar cell 90 in the short-circuit state. As illustrated in FIG. 5, the optically-excited photocarriers (free electrons 71 and holes 73) are drifted in the solar cell 90 in the opened state. However, because the backside electrode 92 and the light receiving surface electrode 96 are opened, drifted charges are accumulated in the semiconductor. Therefore, as illustrated in FIG. 5, photovoltaic power that weakens the internal electric field of the pn-junction 97 is generated, and a Fermi level FL1 becomes a state close to a forward bias.

The intensity of the electromagnetic wave LT1 emitted from solar cell 90 in response to the irradiation of the solar cell 90 with the pulse light LP11 depends on intensity of the internal electric field. Therefore, the electromagnetic wave LT1 emitted from the solar cell 90 in the opened state in response to the irradiation of the solar cell 90 with the pulse light LP11 decreases relatively by the decrease in internal electric field.

On the other hand, as illustrated in FIG. 6, in the solar cell 90 in the short-circuit state, the p-type semiconductor layer 93 is equal to the n-type semiconductor layer 94 in a potential, and a Fermi level FL2 becomes flat. In the pn-junction 97 of the solar cell 90 in the short-circuit state, the free electrons 71 generated by the irradiation flow to a negative electrode on the side of the n-type semiconductor layer 94, and the holes 73 generated by the irradiation flow to a positive electrode on the side of the p-type semiconductor layer 93. The charges are injected into the other semiconductor via the short-circuiting element 99. Then the charges are lost by recombination.

That is, in the short-circuit state, the photocarriers are easily drifted because the charges generated during the opened state are constrained from being accumulated. Therefore, it is considered that the solar cell 90 is put into the short-circuit state to be able to relatively enhance the intensity of the electromagnetic wave LT1 emitted in response to the irradiation of the solar cell 90 with the pulse light LP11.

Again, the configuration of the inspection apparatus 100 will further be described. The stage moving mechanism 15 is a device that moves the stage 11 in a two-dimensional plane. For example, the stage moving mechanism 15 is constructed with an X-Y table or the like. The stage moving mechanism 15 moves the solar cell 90 held by the stage 11 relative to the irradiation part 12. In the inspection apparatus 100, the solar cell 90 can be moved to any position in the two-dimensional plane by the stage moving mechanism 15.

In the preferred embodiment, the stage moving mechanism 15 moves the stage 11 in the X-Y direction, which allows a required inspection range on the solar cell 90 to be scanned with the pulse light LP11. That is, the stage moving mechanism 15 constitutes the scanning mechanism. Alternatively, the scanning of the inspection range may be performed by changing the optical path of the pulse light LP11 instead of moving the stage 11 with the stage moving mechanism 15. Specifically, a galvano-mirror (not illustrated) is provided, and the surface 90S of the solar cell 90 is scanned with the pulse light LP11 in two directions perpendicular to the optical axis of the pulse light LP11. A polygon mirror, a piezoelectric mirror, or an acousto-optical element is considered to be used instead of the galvano-mirror.

The control part 16 is constructed with a general computer including a CPU, a ROM, and a RAM (all of which are not illustrated). The control part 16 is connected to the femtosecond laser 121, the detector 131, the delay stage moving mechanism 143, and the stage moving mechanism 15 shown in FIG. 2. The control part 16 controls operations of these units, and receives data from these units.

The control part 16 is connected to an image generation part 21, a time waveform restoration part 23, and a spectral analyzer 25 shown in FIG. 1. The image generation part 21, the time waveform restoration part 23, and the spectral analyzer 25 may be a function that is implemented by the operation of the CPU included in the control part 16 according to a program (not illustrated), or be implemented in a hardware manner by a dedicated circuit.

The image generation part 21 generates an electric field intensity distribution image in which an electric field intensity distribution of the electromagnetic wave LT1 emitted by the irradiation of the inspection object range (a part or whole of the solar cell 90) of the solar cell 90 with the pulse light LP11 is visualized. In the electric field intensity distribution image, a difference in electric field intensity is visually expressed by a different color or a different pattern.

The time waveform restoration part 23 restores the time waveform of the electromagnetic wave LT1 emitted from the solar cell 90 based on the electric field intensity detected by the detector 131. Specifically, the time the pulse light LP12 reaches the detector 131 is changed by moving the delay stage 141, thereby acquiring the electric field intensity of the electromagnetic wave LT1 detected in each phase. The time waveform of the electromagnetic wave LT1 is restored by plotting the acquired electric field intensity on a time axis.

The spectral analyzer 25 performs a spectral analysis of the solar cell 90 based on the restored time waveform of the electromagnetic wave LT1. Particularly, the spectral analyzer 25 acquires an amplitude intensity spectrum concerning the frequency by performing a Fourier transform of time waveform information.

The monitor 17 and the manipulation and input part 18 are connected to the control part 16. The monitor 17 is a display device such as a liquid crystal display, and displays various pieces of image information to the operator. For example, the image of the surface 90S of the solar cell 90 photographed by the camera 19, the electric field intensity distribution image generated by the image generation part 21, the time waveform of the electromagnetic wave LT1 restored by the time waveform restoration part 23, and the spectral information acquired by the spectral analyzer 25 are displayed on the monitor 17. A GUI (Graphical User Interface) screen necessary to set an inspection condition (such as an inspection range) is also displayed on the monitor 17.

The manipulation and input part 18 is constructed with various input devices such as a mouse and a keyboard. The operator can perform a predetermined manipulation input through the manipulation and input part 18. When a touch panel is used as the monitor 17, the monitor 17 may also act as the manipulation and input part 18.

The control part 16 is connected to a storage (not illustrated) in which various pieces of data are stored. The storage is constructed with a portable medium (such as a magnetic medium, an optical disk medium, and a semiconductor memory) in addition to a fixed disk such as a hard disk. The control part 16 and the storage may be connected to each other through a network.

<1.2. Inspection of Solar Cell>

Figure 7:
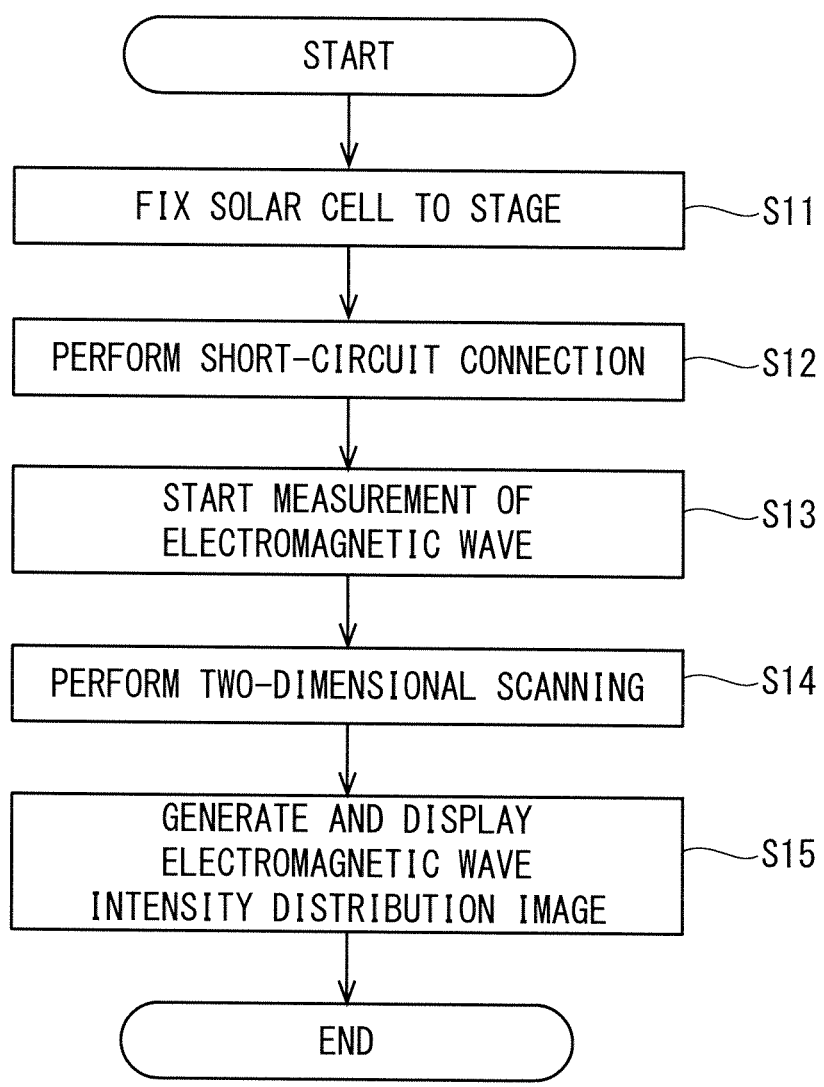
FIG. 7 is a flowchart illustrating an inspection example of the solar cell.

FIG. 7 is a flowchart illustrating an inspection example of the solar cell 90. Hereinafter, unless otherwise noted, it is assumed that each operation of the inspection apparatus 100 is performed under the control of the control part 16. It is assumed that plural processes are concurrently performed depending on a content of each process, or it is assumed that the order of plural processes is properly changed depending on a content of each process.

The solar cell 90 as the inspection target is placed on the stage 11 (Step S11 in FIG. 7). At this point, as described above, the solar cell 90 is set such that the light receiving surface (that is, the principal surface on the side on which sunlight is received in the use state of the solar cell 90) is irradiated with the pulse light LP11.

When the solar cell 90 is placed on the stage 11, electrodes of the short-circuiting element 99 are connected to the backside electrode 92 and light receiving surface electrode 96 of the solar cell 90. Therefore, the solar cell 90 is put into the short-circuit state (Step S12 in FIG. 7).

When the solar cell 90 is put into the short-circuit state, measurement of the electromagnetic wave is started (Step S13 in FIG. 7). Particularly, the solar cell 90 is irradiated with the pulse light LP11 emitted from the femtosecond laser, whereby the electromagnetic wave LT1 emitted from the solar cell 90 is detected by the detector 131.

Any detection time the detector 131 detects the electromagnetic wave LT1 can previously be decided. For example, at any typical point on the solar cell 90, the time waveform of the emitted electromagnetic wave LT1 is restored, and the detection time the electric field intensity of the electromagnetic wave LT1 is maximized may be set to the detection time in Step S13. The decision of the detection time can enhance a possibility that the electromagnetic wave LT1 emitted from each point in the inspection object region of the solar cell 90 is detected with high intensity. As described above, the setting of the detection time is performed by adjusting the delay part 14.

When the measurement of the electromagnetic wave is started, the stage 11 moves in the two-dimensional plane by driving the stage moving mechanism 15. Therefore, the solar cell 90 is two-dimensionally scanned with the pulse light LP11 (Step S14 in FIG. 7).

Particularly, the solar cell 90 moves to a first direction (main scanning direction) parallel to the surface 90S of the solar cell 90, thereby scanning one end to the other end in the inspection object region of the solar cell 90 with the pulse light LP11 (main scanning). Then the solar cell 90 moves to a second direction (sub-scanning direction), which is parallel to the surface 90S of the solar cell 90 and orthogonal to the main scanning direction, by a required pitch (sub-scanning). The solar cell 90 moves in a direction opposite to the first direction to perform the next main scanning. Thus, the two-dimensional scanning of the inspection object region in the solar cell 90 is two-dimensionally scanned by alternately performing the main scanning and the sub-scanning.

When the electric field intensity of the electromagnetic wave LT1 is acquired in each position at which the solar cell 90 is irradiated with the pulse light LP11 in Step S14, the electromagnetic wave intensity distribution image is generated by the image generation part 21, and displayed on the monitor 17 (Step S15 in FIG. 7).

Figure 8:
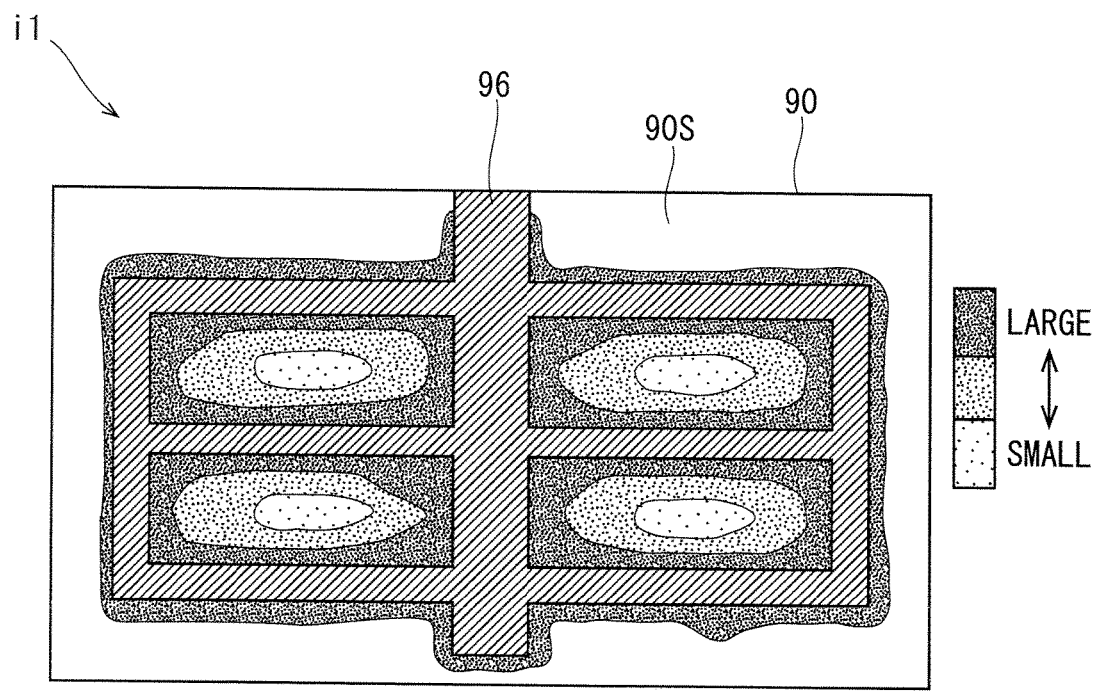
FIG. 8 is a view illustrating an example of an electromagnetic wave intensity distribution image.

FIG. 8 is a view illustrating an example of an electromagnetic wave intensity distribution image i1. According to the electromagnetic wave intensity distribution image i1, the electric field intensity distribution in the solar cell 90 can easily be understood. For example, the defective place of the solar cell 90 can easily be identified based on the electric field intensity distribution.

The inspection apparatus 100 can further analyze the portion that is identified as the defective place in the solar cell 90. Specifically, it is considered that a detailed inspection is performed by restoring the time waveform of the electromagnetic wave LT1 emitted from the portion concerned.

For example, the time waveform includes pieces of information on the generation, movement, and recombination of the photocarriers excited by the pulse light LP11. Therefore, the analysis of the time change of the time waveform is quite effective in analyzing the photocarrier dynamics.

Figure 9:
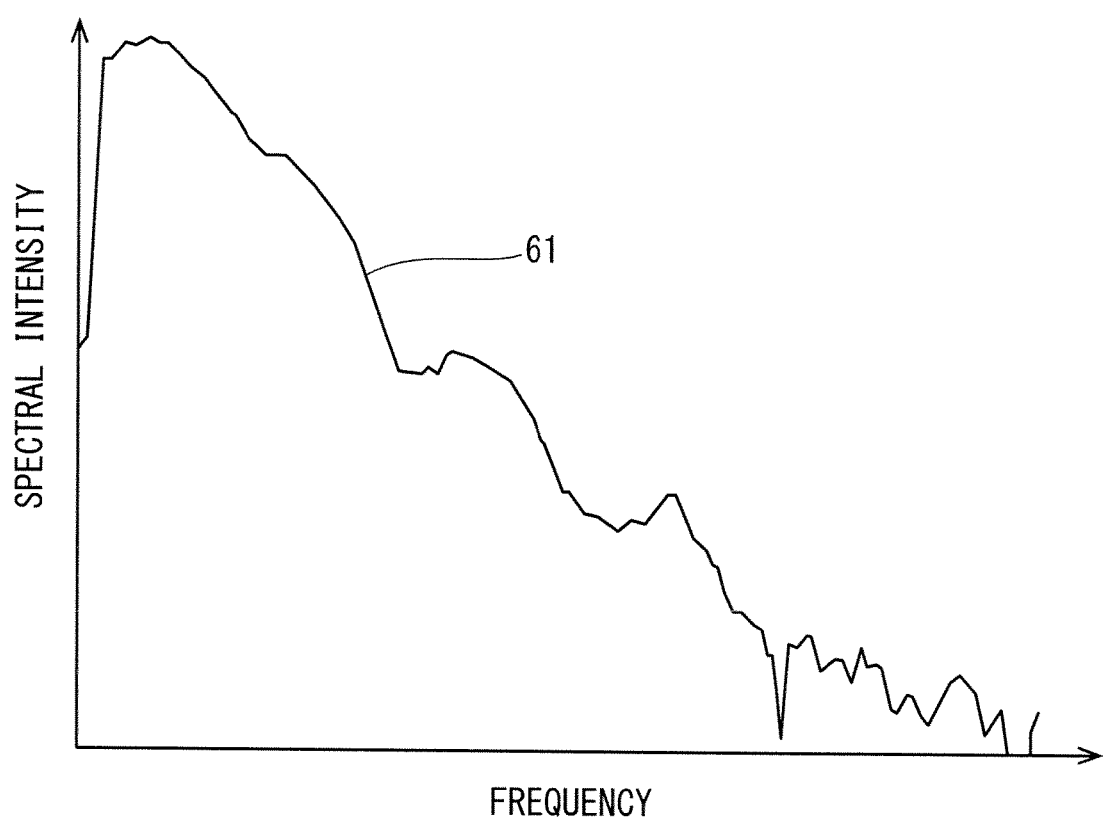
FIG. 9 is a view illustrating an example of a spectral distribution of the electromagnetic wave.

FIG. 9 is a view illustrating an example of a spectral distribution 61 of the electromagnetic wave LT1. The Fourier transform of the time waveform is performed to acquire the spectral distribution 61, which allows information on a physical property to be analyzed in the inspection object portion. In FIG. 9, the vertical axis indicates a spectral intensity and the horizontal axis indicates the frequency.

The inspection based on the time waveform is not necessarily performed after Step S15 (a process of generating and displaying the electromagnetic wave intensity distribution image) shown in FIG. 7. For example, the inspection based on the time waveform ay be performed instead of Step S14 (two-dimensional scanning) shown in FIG. 7.

As described above in the preferred embodiment, the short-circuiting element 99 puts the solar cell 90 into the short-circuit state, which allows the intensity of the emitted electromagnetic wave LT1 to be enhanced compared with the solar cell in the opened state. This enables an S/N ratio to be improved in detecting the electromagnetic wave.

The short-circuiting element 99 can be constructed with a simple electric wire. In the case that a reverse bias voltage is applied to the solar cell 90, it is necessary to provide a power supply in order to generate the high-intensity electromagnetic wave LT1, which results in an increase of apparatus cost. Accordingly, the inspection apparatus 100 of the preferred embodiment is advantageous in cost compared with the conventional inspection apparatus.

The solar cell 90 shown in FIG. 3 is a single-junction type solar cell including one pn-junction 97. The inspection apparatus 100 can also be applied to an inspection of a multi-junction type solar cell.

Figure 10:
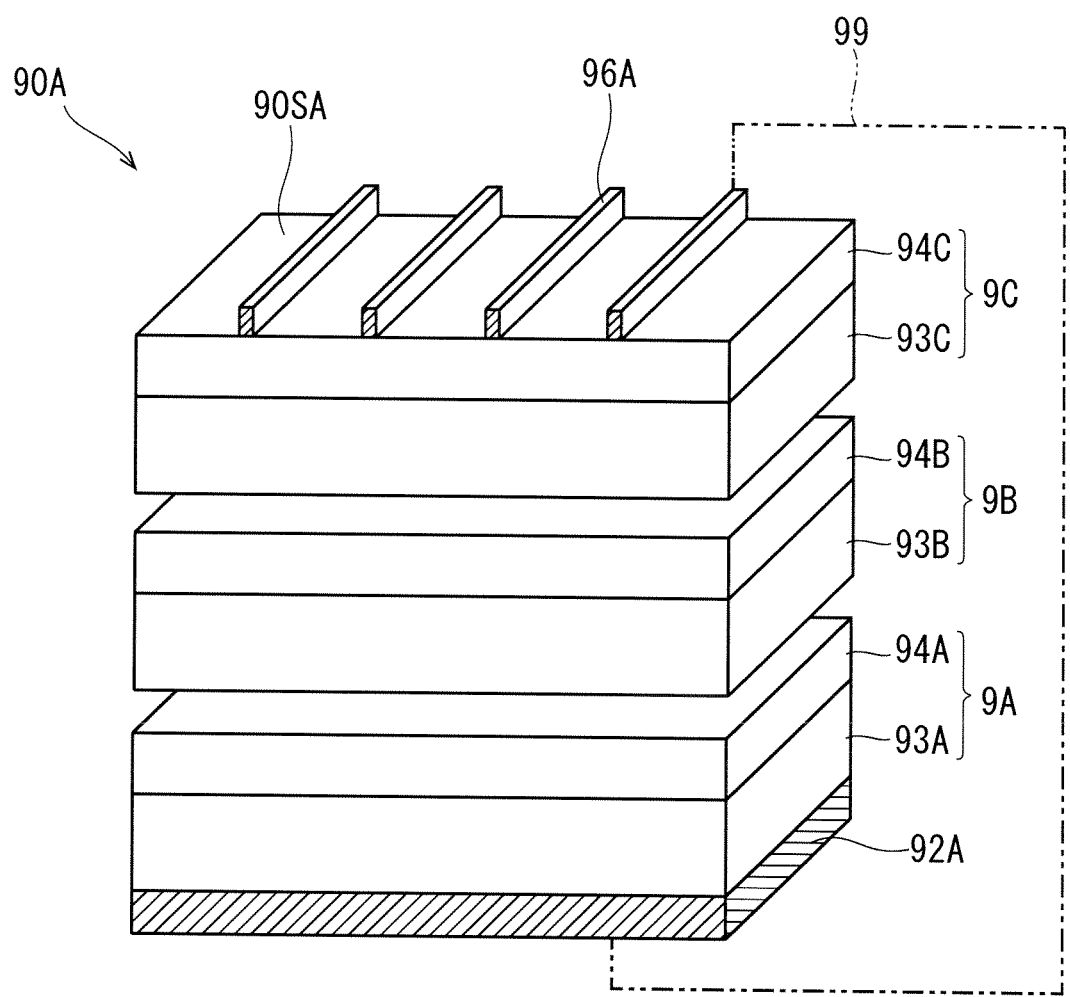
FIG. 10 is a conceptual view illustrating a multi-junction type solar cell.

FIG. 10 is a conceptual view illustrating a multi-junction type solar cell 90A. The solar cell 90A is a three-junction type solar cell. Specifically, the solar cell 90A is constructed by stacking three solar cells 9A, 9B, and 9C having absorption wavelength regions different from one another in the ascending order.

As used herein, the absorption wavelength region means a wavelength region that is mainly absorbed in the solar cell, and the absorption wavelength region can also be called a use wavelength region. The plural solar cells 9A, 9B, and 9C do not completely differ from one another in the absorption wavelength region, but the absorption wavelength regions of the solar cells 9A, 9B, and 9C may be partially overlapped one another.

In the solar cells 9A, 9B, and 9C, similarly to the solar cell 90, p-type semiconductor layers 93A, 93B, and 93C are joined to n-type semiconductor layers 94A, 94B, and 94C to form pn-junctions, respectively. Light receiving surface electrodes 96A are attached to a top surface of the solar cell 9C constituting a light receiving surface (surface 90SA) of the solar cell 90A, and a backside electrode 92A is attached to a bottom surface of the solar cell 9A constituting a back side of the solar cell 90A. The solar cells 9A and 9B are electrically connected to each other, and the solar cells 9B and 9C are electrically connected to each other.

In the multi-junction type solar cell 90A, the short-circuiting element 99 puts the solar cell 90A into the short-circuit state, which allows the higher-intensity electromagnetic wave LT1 to be generated compared with the solar cell 90A in the opened state. Compared with the single-junction type solar cell 90, the multi-junction type solar cell 90A has a higher possibility that the solar cell 90A is broken by the application of the reverse bias voltage. For this reason, the electromagnetic wave LT1 is particularly effectively measured while the multi-junction type solar cell 90A is put into the short-circuit state.

Although the detailed description is omitted, similarly to the three-junction type solar cell 90A, the inspection can be performed in the short-circuit state with respect to multi-junction type solar cells such as a two-junction type solar cell or four or more-junction type solar cell.

<2. Modifications>

In the preferred embodiment, as illustrated in FIG. 2, the surface 90S of the solar cell 90 is obliquely irradiated with the pulse light LP1, and the detector 131 detects the electromagnetic wave LT1 emitted from the side of the surface 90S. Alternatively, for example, the inspection apparatus 100 may have a configuration in which the surface 90S of the solar cell 90 is perpendicularly irradiated with the pulse light LP11 to detect the electromagnetic wave LT1 emitted in the direction coaxial with the pulse light LP11. When a transparent conductive film substrate (ITO) is used, the electromagnetic wave LT1 is selectively reflected while the pulse light LP11 is transmitted, and the optical path of the electromagnetic wave LT1 can be changed.

Alternatively, the inspection apparatus 100 may have a configuration in which the surface 90S of the solar cell 90 is irradiated with the pulse light LP11 to detect the electromagnetic wave LT1 emitted onto the back side of the solar cell 90.

In the preferred embodiment, the identical femtosecond laser 121 is used as the light source of the pulse light LP11 with which the solar cell 90 is irradiated and the light source of the pulse light LP12 incident to the detector 131. Therefore, the pulse light LP11 is identical to the pulse light LP12 in a pulse period. Alternatively, the pulse light LP11 and the pulse light LP12 may be emitted from different femtosecond lasers having the identical pulse period.

It is also conceivable that two variable wavelength lasers having slightly different oscillation frequencies are used instead of the femtosecond laser 121. Particularly, two laser beams emitted from the variable wavelength lasers are overlapped with each other using a coupler (not illustrated)

formed by an optical fiber that is of an optical waveguide, thereby generating an optical beat signal corresponding to a difference between the frequencies. The electromagnetic wave (terahertz wave) corresponding to the frequency of the optical beat signal can be emitted by irradiating the solar cell 90 with the optical beat signal. A distributed-feedback (DFB) laser that substantially continuously (for example, every 2 nm) changes the wavelength of the emitted laser beam by temperature control can be used as a variable wavelength laser.

In the preferred embodiment, as illustrated in FIG. 3, the solar cell 90 in which the pn-junction 97 is formed is described by way of example. Additionally, a solar cell in which an intrinsic semiconductor layer is sandwiched between the p-type semiconductor layer 93 and the n-type semiconductor layer 94, namely, a solar cell in which what is called a pin-junction is formed can become the inspection object of the inspection apparatus 100. Not the pn-junction 97 but what is called a Schottky barrier diode in which the p-type semiconductor or the n-type semiconductor and metal are joined can become the inspection object of the inspection apparatus 100. In both the types, the short-circuiting element 99 electrically connects the cathode and the anode of the inspection object to put the inspection object into the short-circuit state, and the electromagnetic wave can be measured in the short-circuit state.

While the invention has been shown and described in detail, the foregoing description is in all aspects illustrative and not restrictive. It is therefore understood that numerous modifications and variations can be devised without departing from the scope of the invention.

What is claimed is:

1. An inspection apparatus that inspects an inspection object including an anode and a cathode, the inspection apparatus comprising:
    a short-circuiting element that electrically connects the anode and the cathode of said inspection object to short-circuit said inspection object;
    an irradiation part that irradiates said inspection object short-circuited by said short-circuiting element with pulse light having a wavelength of 360 nm to 1.5 µm;
    a detection part that detects a terahertz wave having a frequency band of 0.1 THz to 30 THz emitted from said inspection object in response to the irradiation of said inspection object with said pulse light from said irradiation part,
    wherein said detection part includes:
        a photoconductive antenna that detects said terahertz wave at the timing when pulse light for detection is incident on the photoconductive antenna; and
        a delay unit that changes a time difference between the time when said terahertz wave reaches said photoconductive antenna and the time when said pulse light for detection reaches said photoconductive antenna and thereby delays the timing of detecting said terahertz wave with said photoconductive antenna;
    a scanning mechanism that scans said inspection object with said pulse light; and
    an image generator that generates an electromagnetic wave intensity distribution image based on data obtained by said scanning mechanism.

2. The inspection apparatus according to claim 1, wherein said anode is a p-type semiconductor and said cathode is an n-type semiconductor.

3. The inspection apparatus according to claim 1, wherein said inspection object is a multi-junction type solar cell formed by stacking a plurality of solar cells having absorption wavelength regions different from each other.

4. An inspection method for inspecting an inspection object including an anode and a cathode, the inspection method comprising the steps of:
    (a) electrically connecting said anode and said cathode to short-circuit said inspection object;
    (b) irradiating said inspection object, which is put into the short-circuit state in said step (a), with pulse light having a wavelength of 360 nm to 1.5 µm to detect a terahertz wave having a frequency band of 0.1 THz to 30 THz emitted from said inspection object in response to the irradiation of said inspection object with the pulse light,
    wherein said step (b) includes the steps of:
    scanning said inspection object with said pulse light;
    detecting said terahertz wave at the timing when pulse light for detection is incident on a photoconductive antenna; and
    changing a time difference between the time when said terahertz wave reaches said photoconductive antenna and the time when said pulse light for detection reaches said photoconductive antenna and thereby delaying the timing of detecting said terahertz wave with said photoconductive antenna; and
    (c) generating an electromagnetic wave intensity distribution image based on data obtained in said step (b).

5. The inspection method according to claim 4, wherein said anode is a p-type semiconductor and said cathode is an n-type semiconductor.

6. The inspection method according to claim 4, wherein said inspection object is a multi-junction type solar cell formed by stacking a plurality of solar cells having absorption wavelength regions different from each other.

* * * * *